United States Patent [19]
Jeong

[11] Patent Number: 5,936,899
[45] Date of Patent: Aug. 10, 1999

[54] WAFER BURN-IN TEST CIRCUIT OF A SEMICONDUCTOR MEMORY DEVICE

[75] Inventor: Dong Sik Jeong, Kyoungki-do, Rep. of Korea

[73] Assignee: Hyundai Electronics Industries Co., Ltd., Kyoungki-do, Rep. of Korea

[21] Appl. No.: 08/964,892

[22] Filed: Nov. 5, 1997

[30] Foreign Application Priority Data

Nov. 6, 1996 [KR] Rep. of Korea ....................... 96-52254

[51] Int. Cl.$^6$ ..................................... G11C 7/00
[52] U.S. Cl. ..................... 365/201; 365/230.06; 365/191
[58] Field of Search .............................. 365/201, 230.06, 365/203, 191

[56] References Cited

U.S. PATENT DOCUMENTS

| | | | |
|---|---|---|---|
| 5,265,057 | 11/1993 | Furuyama et al. | 365/201 |
| 5,282,167 | 1/1994 | Tanaka et al. | 365/206 |
| 5,381,373 | 1/1995 | Ohsawa | 365/201 |
| 5,544,123 | 8/1996 | Hoshi et al. | 365/230.06 |
| 5,590,079 | 12/1996 | Lee et al. | 365/201 |

FOREIGN PATENT DOCUMENTS 0 492 610 A1   7/1992   European Pat. Off. .
0 574 002 A2  12/1993   European Pat. Off. .

*Primary Examiner*—David Nelms
*Assistant Examiner*—Thong Le
*Attorney, Agent, or Firm*—Thelen Reid & Priest LLP

[57] ABSTRACT

A wafer burn-in test circuit of a semiconductor memory device which can provide a burn-in stress voltage by only using a prior word line driver without additional devices or circuits. The wafer burn-in test circuit of the present invention comprises a row address pre-decoding circuit for selecting and driving a predetermined word line by a combination composed of row address signals, a word line driving control circuit for outputting a first signal to selectively drive the word line when at least one signal among address signals pre-decoded by the row address pre-decoding circuit is enabled, and outputting a second signal to enable the all word lines with no relation to a logic status of the address signals when a wafer burn-in signal is inputted, and a row decoder circuit for receiving output signals provided from the row address pre-decoding circuit and the word line driving control circuit therein, and for selectively driving the word line by the address signal in a normal mode of operation and simultaneously driving a plurality of word lines in a wafer burn-in mode of operation.

4 Claims, 9 Drawing Sheets

WAFER BURN-IN TEST CIRCUIT OF A SEMICONDUCTOR MEMORY DEVICE

BACKGROUND OF THE INVENTION

1. Field of the Invention

This invention relates generally to a wafer burn-in test circuit of a semiconductor memory device, and more particularly to a wafer burn-in test circuit which can provide a burn-in stress voltage by only using a prior word line driver without additional devices or circuits as a wafer burn-in test is performed.

2. Description of the Prior Art

Generally, a burn-in test of a semiconductor memory device is performed after wafer fabrication is completed so as to find a defective memory cell by supplying a high stress voltage (i.e., burn-in voltage) or to reduce a burn-in test time in an operation voltage range. At present, in a case where a conventional 16 Mb dynamic random access memory (DRAM), the burn-in test circuit is operated in accordance with a 1K or a 4K refresh option, wherein the 1K option is 16ea word line active and the 4K option is 4ea word line active. In a 16Mb DRAM composed of a 16K row×a 1k column, in order to supply the stress voltage to whole word lines, it is requires 1K times of a row active which is obtained by 16K over 16ea (i.e., 16ea row active in one time row active) In a similar manner, in a case of a 4K refresh, 4K times for the row active should be performed. Further, the total test time required for performing the burn-in test in whole cells of the 16Mb DRAM is 24 hours (i.e., one day) in 1K refresh or 96 hours (i.e., four days) in 4K refresh. Accordingly, the test cost is highly increased in proportion to these long test times.

In a conventional burn-in test, the wafer burn-in circuit is used so as to reduce both the burn-in test time and the cost thereof. In such a manner, a stress voltage is provided to gate oxide layers of whole word lines by turning on multi-word lines during a row active. The wafer burn-in test time according to such manner is reduced to 68.4 sec. At this stage, the time is obtained from the following equation.

$$T=\text{cycle time}\times 2(\text{write/read})\times 1m(16K\text{ row})\times 1K\text{ column}\times\text{stress number}$$

(i.e., T=500 ns×2×1×1K×68,400 (s)=68.4 sec)

The operation of the conventional wafer burn-in test will now be described with reference to FIGS. 1 through 5.

FIG. 1 is a schematic diagram illustrating a row decoder circuit according to a conventional wafer burn-in test circuit.

In a normal mode of operation, a wafer burn-in signal wbi which is applied to a NOR gate is maintained at a logic low level, thereby driving all word lines selected by a row address.

On the other hand, in a wafer burn-in mode of operation, a wafer burn in signal wbi which is applied to a NOR gate is maintained at a logic high level, and transistors connected to an output node B coupled to the NOR gate is turned on. Next, the burn-in stress voltage VPP is supplied to a plurality of word lines WL0–WL3 by turning on all pass transistors coupled to a control voltage VG.

It is noted that the conventional wafer burn-in test circuit requires not only a pass transistors group controlled by the control voltage VG for applying the high stress voltage, but also a plurality of NOR gates for selectively driving a word line driver in accordance with receiving the wafer burn-in signal wbi therein.

Under these conditions, the number of the word lines is increased further, the number of the pass transistors group and NOR gates are more highly increased, and the word lines structure is highly integrated in the area of the semiconductor memory devices.

FIG. 2 is a circuit diagram illustrating a wafer burn-in signal generating circuit according to the conventional wafer burn-in circuit.

Referring to FIG. 2, in the wafer burn-in mode of operation, if a power voltage is applied to a wbi pad, the wafer burn-in signal wbi is an output signal of the wafer burn-in signal generating circuit and becomes the logic high level and is simultaneously inputted to input terminals shown FIGS. 1 and 3.

Accordingly, by the wafer burn-in signal wbi, the stress voltage can be simultaneously provided to whole word lines during the active cycle.

FIG. 3 is a circuit diagram illustrating a row address pre-decoder circuit according to the conventional wafer burn-in test circuit.

According to FIG. 3, in the wafer burn-in mode of operation, if the wafer burn-in signal wbi is the logic high level, all decoded row addresses ax23, ax23b, ax2b3, and ax2b3b become the logic low level to thereby input to an input terminal shown in FIG. 4.

FIG. 4 is a circuit diagram illustrating a row address pre-decoder driving signal generating circuit according to the conventional wafer burn-in test circuit.

With reference now to FIG. 4, an output signal xdpb of the row address pre-decoder driving signal generating circuit is maintained at the logic low level by a row address ax230:3 which is outputted from the row address pre-decoder circuit shown in FIG. 3. In the wafer burn-in mode of operation, both the row decoder inputs ax23, ax45, and ax67 are maintained at the logic low level and if the output signal xdpb of the row address pre-decoder driving signal generating circuit is also maintained at logic low level, then the node A coupled to an output terminal of an inverter and a node B coupled to an output terminal of a NAND gate are maintained at the logic low level.

Next, as described hereinbefore with reference to FIG. 1, the high stress voltage VPP for performing the burn-in test is supplied to the plurality of word lines WL0–WL3 by turning on the pass transistors coupled to the control voltage VG. FIG. 5 shows the timing operations in the conventional wafer burn-in test circuit.

As described, the conventional wafer burn-in test circuit should require the pass transistors group and the plurality of NOR gates for applying the high stress voltage VPP as illustrated in FIG. 1 so that the plurality of word lines is simultaneously driven during one active cycle. Accordingly, the word lines structure is highly integrated in the semiconductor memory chip and an entire size of the semiconductor memory chip is bigger.

SUMMARY OF THE INVENTION

It is an object of the present invention to solve the problem involved in the prior art, and to provide an wafer burn-in test circuit which can provide a burn-in stress voltage by only using the prior world line driver without using the pass transistors and NOR gates which are used in the prior art when a wafer burn-in test is performed.

It is an other object of the present invention to provide a wafer burn-in test circuit which can repair a defective cell by supplying a stress voltage to multi-word lines during one cycle before performing a repair operation in a wafer status, thereby finding the defective cells and improving the efficiency of a production line thereof.

In an aspect of the present invention, there is provided a wafer burn-in test circuit for a semiconductor memory device having a plurality of memory cells connected to a word line, the wafer burn-in test circuit comprises a row address pre-decoding circuit for selecting and driving a predetermined word line by a combination composed of row address signals, a word line driving control circuit for outputting a first signal to selectively drive the word line when at least one signal among address signals pre-decoded by the row address pre-decoding circuit is enabled, and outputting a second signal to enable the all word lines with no relation to a logic status of the address signals when a wafer burn-in signal is inputted, and a row decoder circuit for receiving output signals provided from the row address pre-decoding circuit and the word line driving control circuit therein, and for selectively driving the word line by the address signal in a normal mode of operation and simultaneously driving a plurality of word lines in a wafer burn-in mode of operation.

BRIEF DESCRIPTION OF THE DRAWINGS

The above objects and other features of the present invention will become more apparent by describing the preferred embodiments thereof with reference to the accompanying drawings, in which.

DETAILED DESCRIPTION OF THE PREFERRED EMBODIMENT

The preferred embodiments of the present invention will now be explained with reference to the accompanying drawings.

Figure 6:
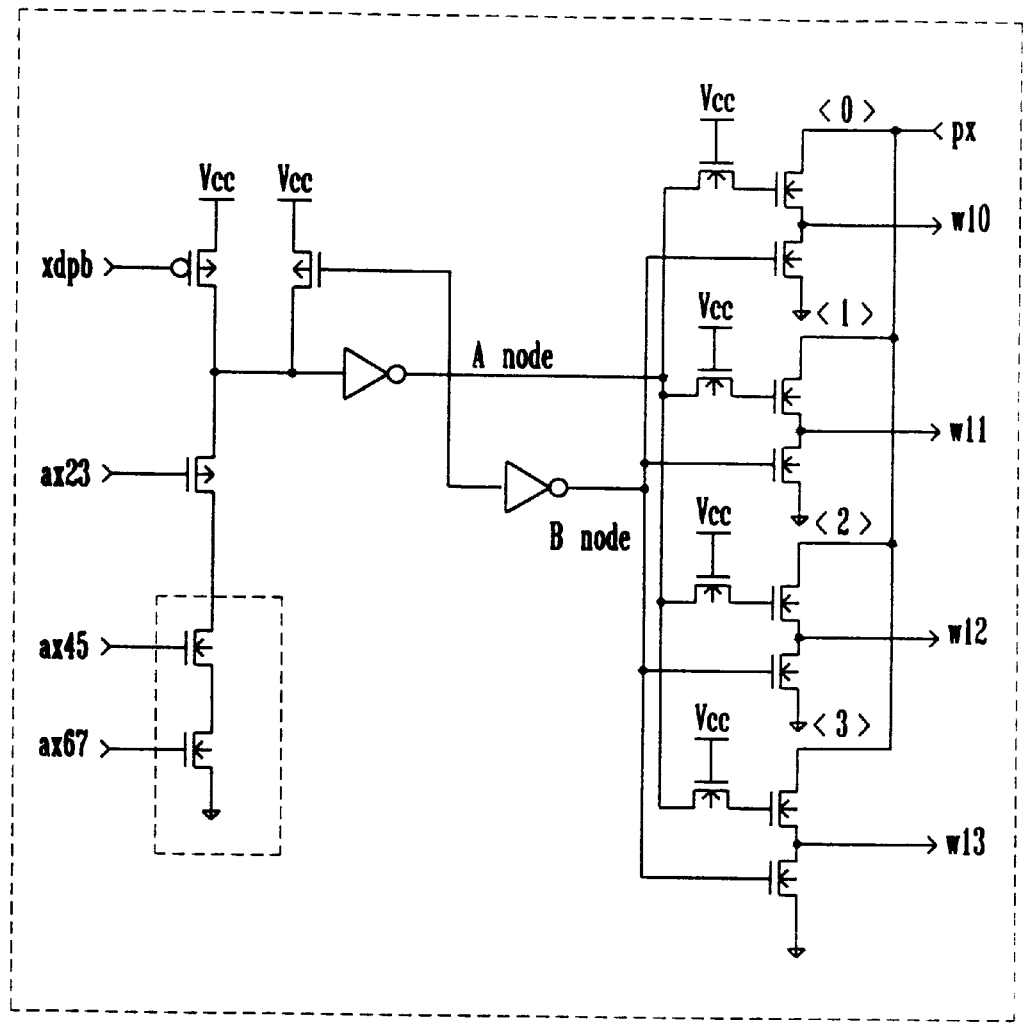
FIG. 6 is a schematic diagram illustrating a row decoder circuit according to the wafer burn-in test circuit of the present invention.

FIG. 6 is a schematic diagram illustrating a row decoder circuit according to a wafer burn-in test circuit of the preferred embodiment of the present invention. In a normal mode of operation, the row decoder circuit selectively drives word lines by an inputted address signal, while in a wafer burn-in mode of operation, the row decoder circuit simultaneously drives all word lines.

Figure 1:
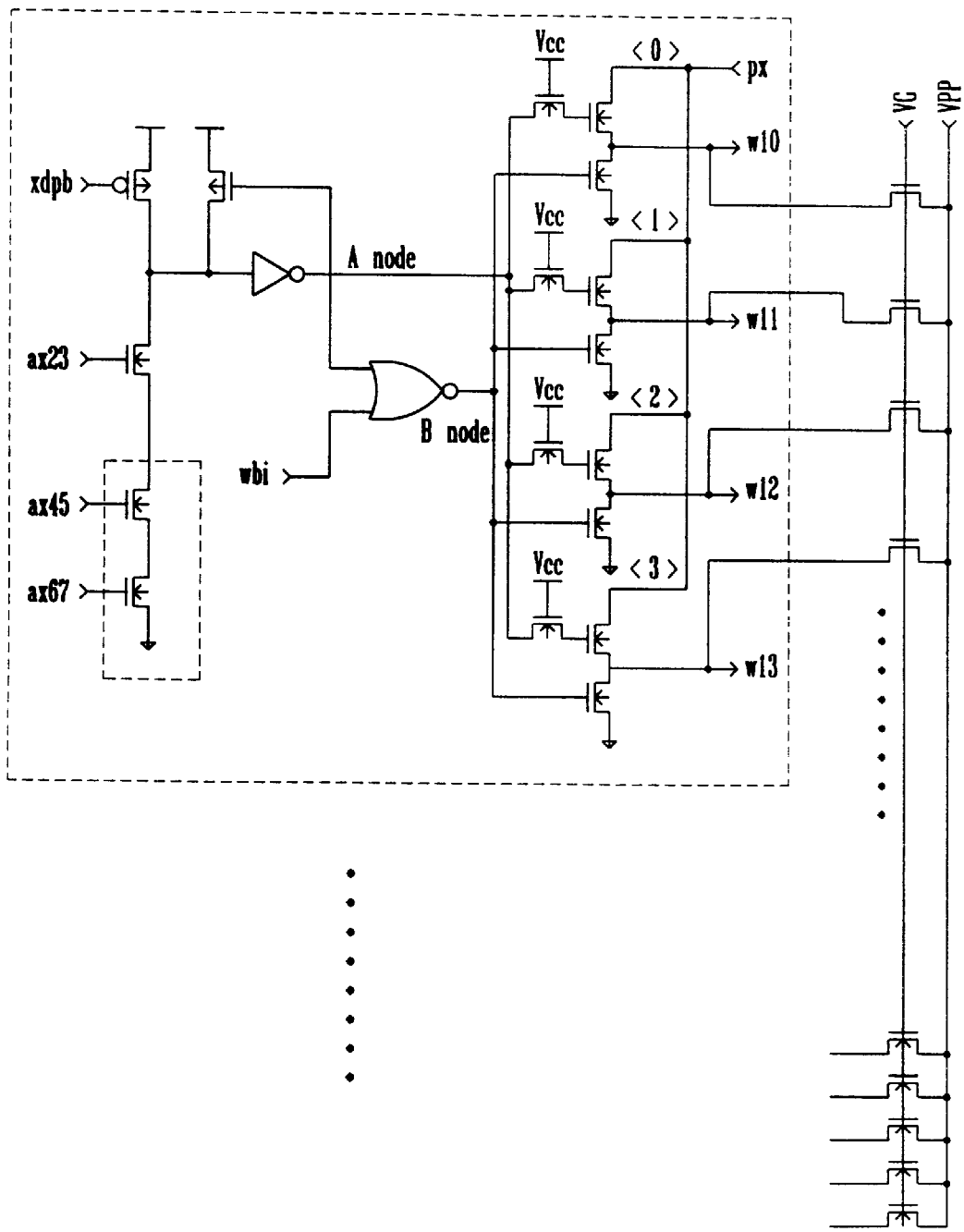
FIG. 1 is a schematic diagram illustrating a row decoder circuit according to a conventional wafer burn-in test circuit.
Figure 2:
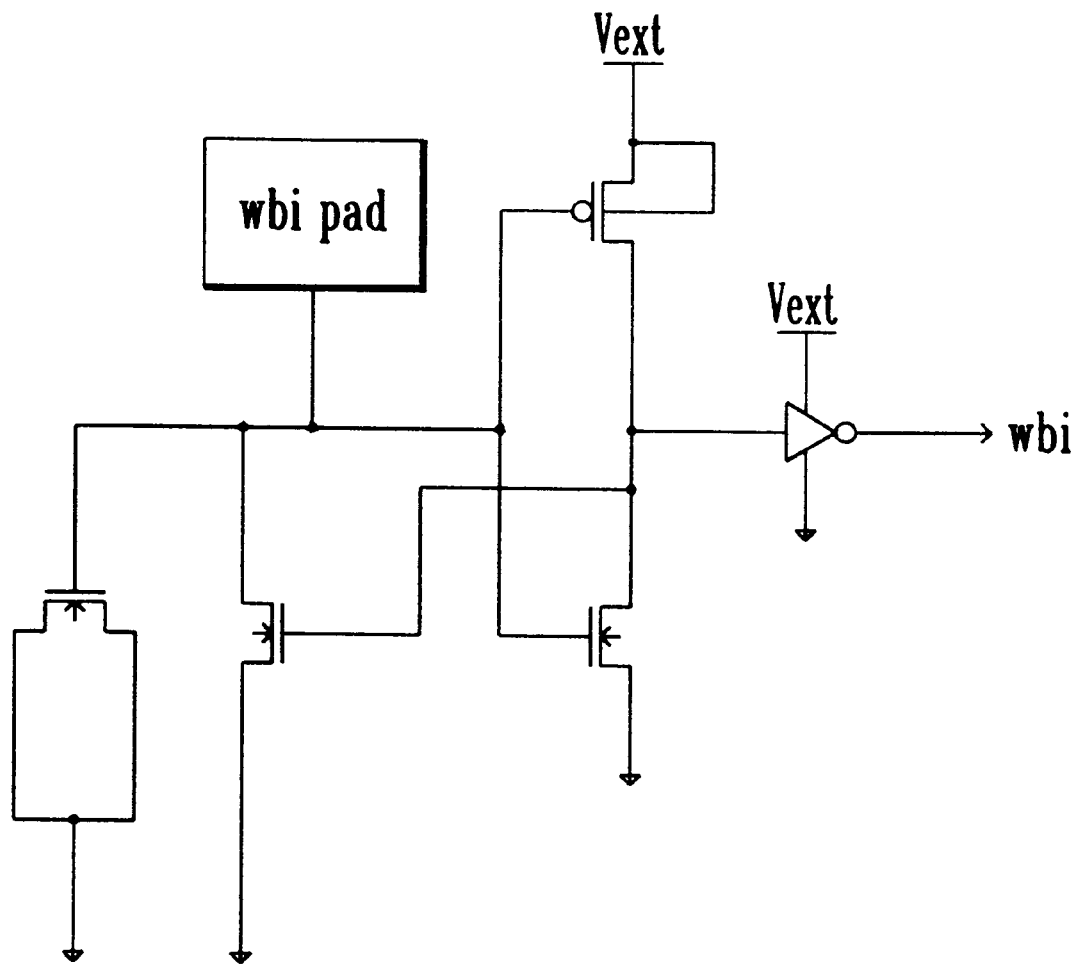
FIG. 2 is a circuit diagram illustrating a wafer burn-in signal generating circuit according to the conventional wafer burn-in circuit.
Figure 3:
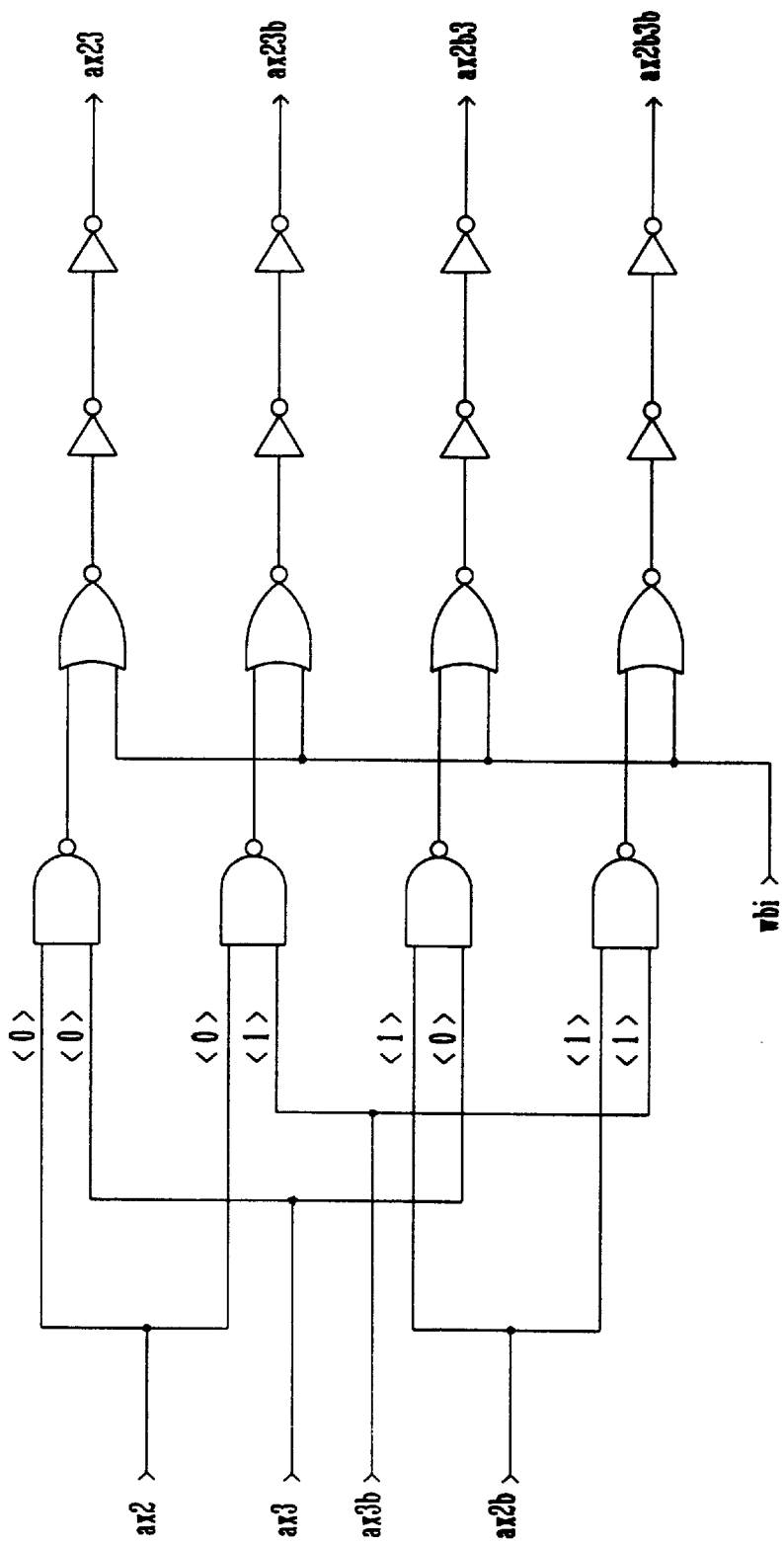
FIG. 3 is a circuit diagram illustrating a row address pre-decoder circuit according to the conventional wafer burn-in test circuit.
Figure 4:
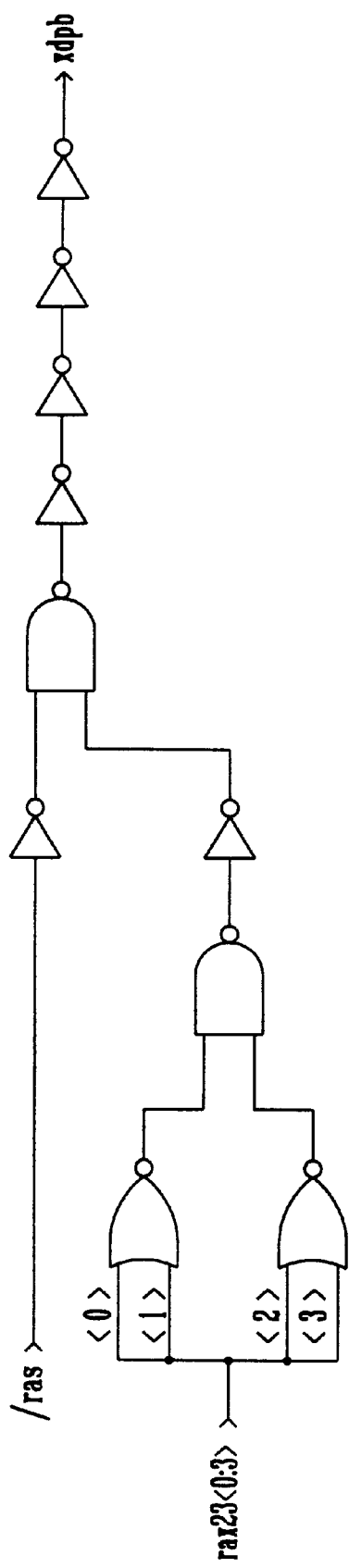
FIG. 4 is a circuit diagram illustrating a row address pre-decoder driving signal generating circuit according to the conventional wafer burn-in test circuit.
Figure 5:
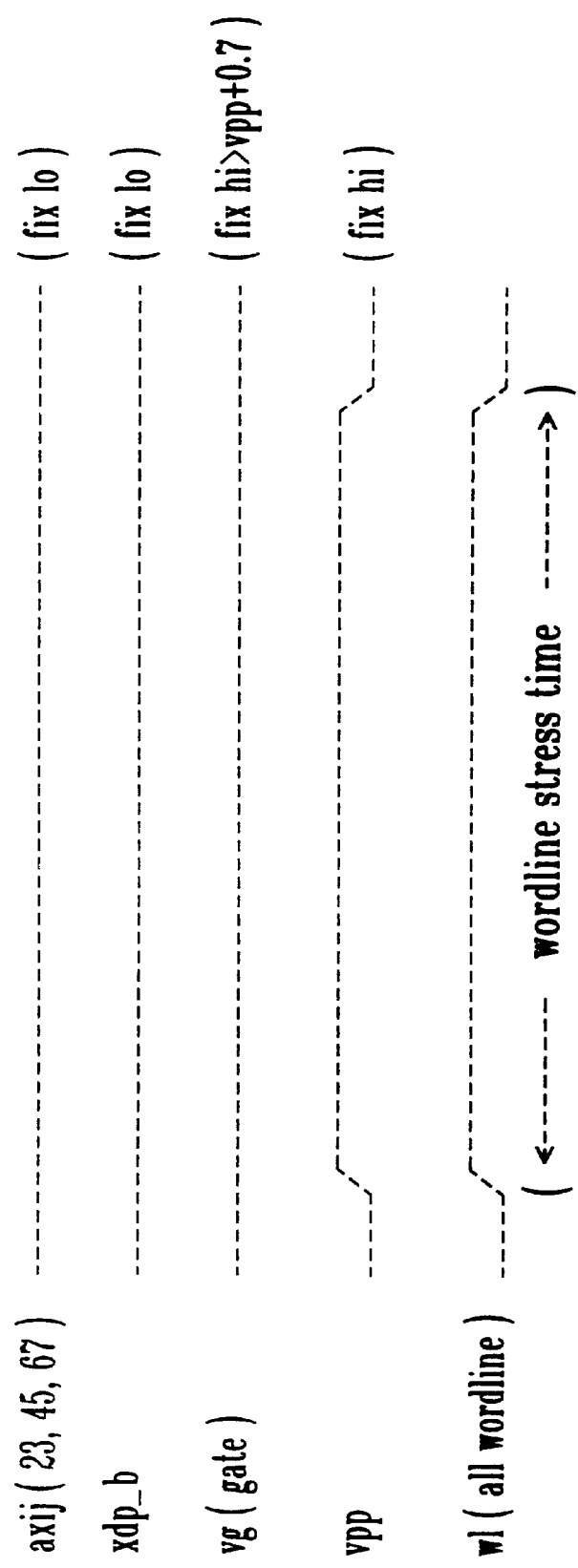
FIG. 5 is a timing diagram illustrating an operation of the conventional wafer burn-in test circuit.

With reference to FIG. 6, it is noted that the row decoder circuit does not include NOR gates for receiving a wafer burn-in signal wbi nor pass transistors for applying high stress voltage to word lines WL0–WL3, and these structures distinguish the prior row decoder circuit depicted in FIG. 1 from that of the present invention.

The operation of the row decoder circuit of the present invention will now be described with reference to FIGS. 6 through 9.

Figure 8:
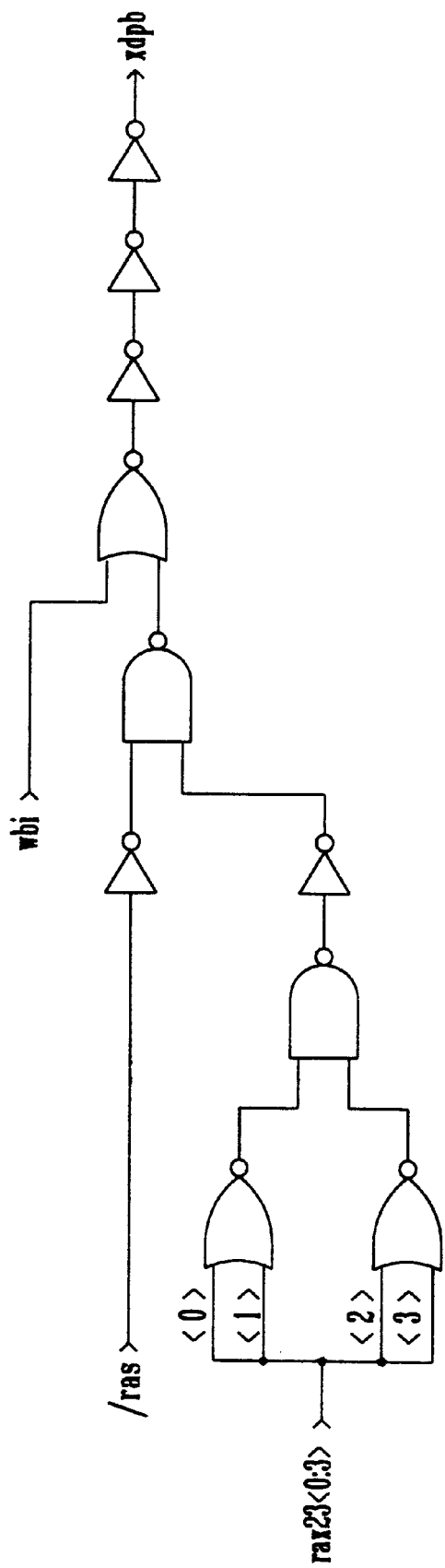
FIG. 8 is a circuit diagram illustrating a row address pre-decoder driving signal generating circuit according to the wafer burn-in test circuit of the present invention.

FIG. 8 is a circuit diagram illustrating a row address pre-decoder driving signal xdpb generating circuit according to the wafer burn-in test circuit of the present invention.

With reference to FIG. 8, in the normal mode of operation, row address pre-decoder driving signal generating circuit outputs a signal corresponding to a combination of address signals decoded by the row address pre-decoder driving signal generating circuit. By contrast, with no relation to the row address circuit, the output signal xdpb of the row address pre-decoder driving signal generating circuit, which will be inputted to the row decoder circuit depicted in FIG. 6, is maintained at the logic high level, and address signals ax23, ax45, ax67 are also maintained at the logic high level in the wafer burn-in mode of operation, thereby becoming the logic high level at the node A.

Thus, the node B becomes the logic low level and a boosting voltage px is applied to the word lines WL0–WL3, thereby providing the burn-in stress voltage. Namely, it is noted that the burn-in stress voltage is applied to the word lines through the normal row decoder circuit in the preferred embodiment of the present invention.

Figure 7:
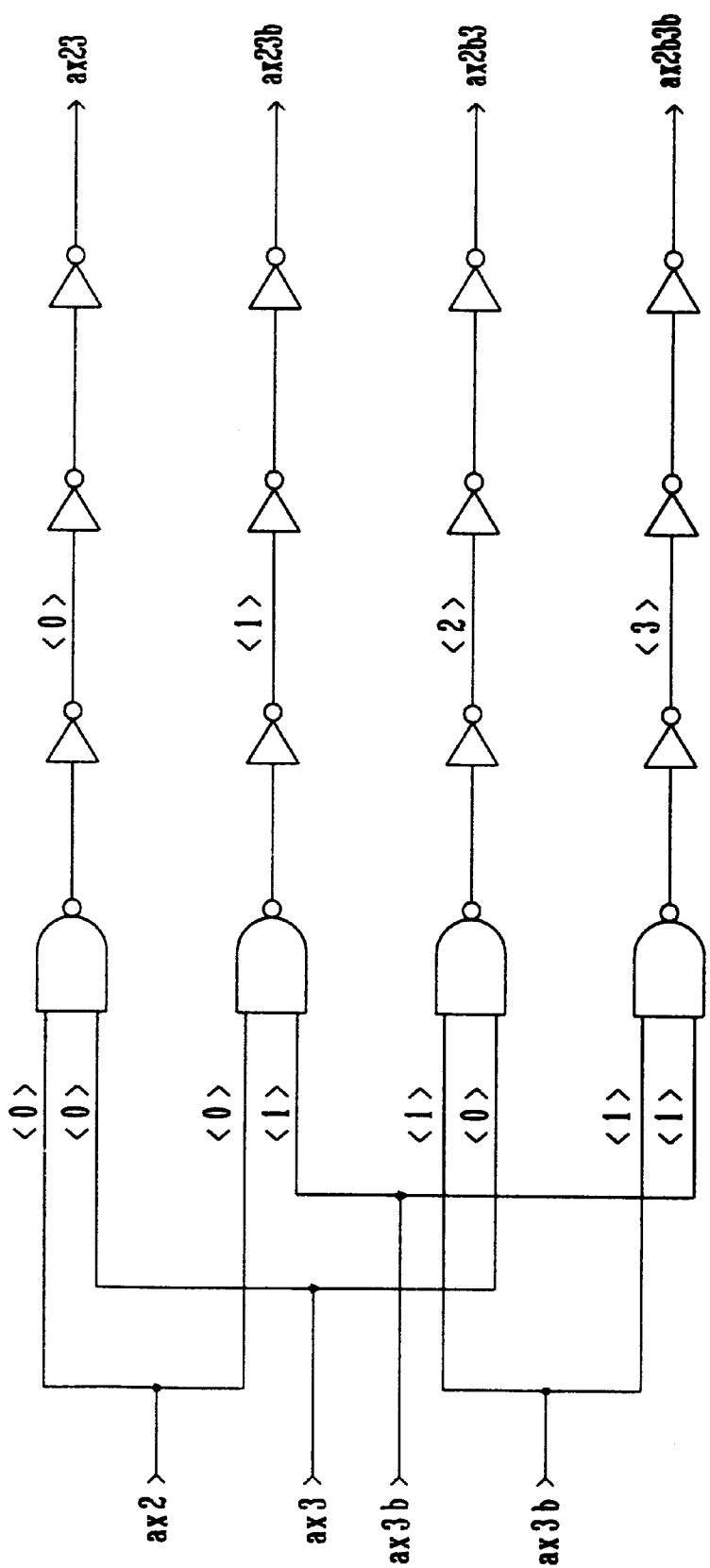
FIG. 7 is a circuit diagram illustrating a row address pre-decoder circuit according to the wafer burn-in test circuit of the present invention.

FIG. 7 is a circuit diagram illustrating a row address pre-decoder circuit according to the wafer burn-in test circuit of the present invention. The row address pre-decoder circuit makes an input address signal to be inputted to the row decoder circuit depicted in FIG. 6.

With reference to FIG. 7, it is noted that the row address pre-decoder circuit of the present invention does not require the wafer burn-in signal. Because the row decoder is actually controlled by the output signal xdpb of the row address pre-decoder driving signal generating circuit, which includes the wafer burn-in signal, as depicted in FIG. 8.

Figure 9:
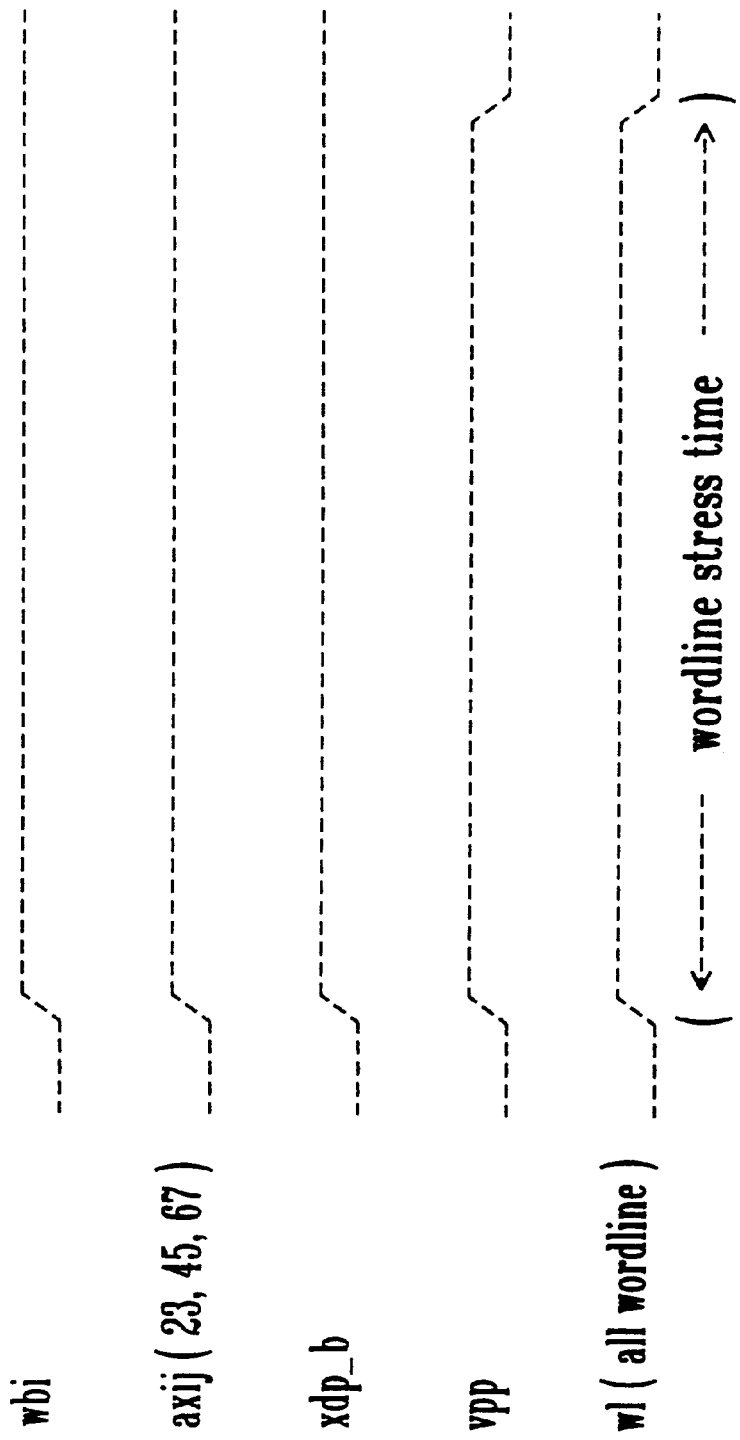
FIG. 9 is a timing diagram illustrating an operation of the wafer burn-in test circuit of the present invention.

FIG. 9 is a timing diagram illustrating an operation of the wafer burn-in test circuit of the present invention. As shown in FIG. 9, the wafer burn-in test time is identical to that of the prior art. However, no pass transistors group and NOR gates are required in semiconductor memory devices of the preferred embodiment of the present invention, thereby saving a larger area for construction of the memory devices.

As described above, the wafer burn-in test circuit of the present invention solves the problem in the prior art of the memory chip size being larger because it only uses the word line driver which is provided with the burn-in stress voltage during the wafer burn-in mode of operation, and does not use any additional devices such as a pass transistors, NOR gates and the like.

Further, the wafer burn-in test circuit of the present invention provides an advantage that the defective cells are found by supplying the stress voltage to multi-word lines during one cycle before performing a repair operation in a wafer status, thereby improving the efficiency of a production line thereof.

Many modifications and variations of the present invention are possible in light of the above teachings. Therefore, it is to be understood that within the scope of the appended claims, the invention may be practiced otherwise than as specifically described.

What is claimed is:

1. A wafer burn-in test circuit for a semiconductor memory device having a plurality of memory cells connected to a word line, said wafer burn-in test circuit comprising:

a) a row address pre-decoding circuit for selecting and driving a predetermined word line by a combination of row address signals;
b) a word line driving control circuit for outputting:
   1) a first signal to selectively drive the word line in a normal mode of operation when at least one signal among address signals pre-decoded by said row address pre-decoding circuit is enabled, and
   2) a second signal to enable the all word lines with no relation to a logic status of the address signals in a wafer burn-in mode of operation;
   wherein:
      A) the word line driving control circuit includes means for receiving a burn-in test signal; and
      B) the second signal is activated when the burn-in test signal is enabled; and
c) a row decoder circuit for receiving output signals provided from said row address pre-decoding circuit and said word line driving control circuit and constituting:
   1) means for selectively driving said word line by the address signal in the normal mode of operation, and
   2) means for simultaneously driving a plurality of word lines in the wafer burn-in mode of operation.

2. The wafer burn-in test circuit as set forth in claim 1, wherein said row decoder circuit provides an word line boosting voltage to a word line selected by said address signal when an output signal of said word line driving control circuit is enabled by the wafer burn-in signal.

3. The wafer burn-in test circuit as set forth in claim 1, wherein said first signal is determined by row address signals and an address signal outputted from said row address pre-decoding circuit.

4. The wafer burn-in test circuit as set forth in claim 1, wherein said second signal has a same logic level as that of said wafer burn-in signal.

* * * * *